United States Patent
Yen

(10) Patent No.: US 8,305,482 B2
(45) Date of Patent: Nov. 6, 2012

(54) CAMERA MODULE WITH PERPENDICULARITY ADJUSTMENT ASSEMBLY

(75) Inventor: Shih-Chieh Yen, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 451 days.

(21) Appl. No.: 12/630,960

(22) Filed: Dec. 4, 2009

(65) Prior Publication Data

US 2010/0265387 A1    Oct. 21, 2010

(30) Foreign Application Priority Data

Apr. 20, 2009   (CN) .......................... 2009 1 0301678

(51) Int. Cl.
*H04N 5/228*    (2006.01)

(52) U.S. Cl. .................................... 348/345; 348/208.2

(58) Field of Classification Search .................. 348/345, 348/208.2
See application file for complete search history.

(56) References Cited

U.S. PATENT DOCUMENTS

| | | | |
|---|---|---|---|
| 7,251,087 B2 * | 7/2007 | Yamashita | 359/822 |
| 2005/0001906 A1 * | 1/2005 | Sato et al. | 348/208.6 |
| 2006/0092285 A1 * | 5/2006 | Shin | 348/208.7 |
| 2008/0080071 A1 * | 4/2008 | Kawashiki | 359/822 |
| 2009/0009656 A1 * | 1/2009 | Honda et al. | 348/372 |
| 2009/0027785 A1 * | 1/2009 | Tanaka et al. | 359/824 |
| 2011/0317287 A1 * | 12/2011 | Aoki et al. | 359/813 |
| 2012/0182436 A1 * | 7/2012 | Hu et al. | 348/208.99 |

* cited by examiner

*Primary Examiner* — Jason Chan
*Assistant Examiner* — Cynthia Segura
(74) *Attorney, Agent, or Firm* — Altis Law Group, Inc.

(57) ABSTRACT

A camera module includes an optical assembly, an image sensor, a barrel holder, an angle measurement assembly, a perpendicularity adjustment assembly and a controller. The optical assembly has an optical axis. The image sensor has a light surface. The optical assembly and the image sensor are housed in the barrel holder. The angle measurement assembly is configured for measuring perpendicularity of the optical axis to the light sensing surface of the image sensor. The perpendicularity adjustment assembly is arranged between the optical assembly and the barrel holder, and includes an electrostrictive member deformable in response to a voltage, thereby adjusting the perpendicularity of the optical axis to the light sensing surface. The controller is configured for providing the voltage to the perpendicularity adjustment assembly to deform the electrostrictive member.

16 Claims, 10 Drawing Sheets

CAMERA MODULE WITH PERPENDICULARITY ADJUSTMENT ASSEMBLY

BACKGROUND

1. Field of the Invention

The disclosure relates to a camera module having a perpendicularity of an optical axis of an optical assembly to a light sensing surface of a self-adjustable image sensor.

2. Description of Related Art

Ongoing developments in microcircuitry and multimedia technology have allowed digital imaging devices to gain popularity. For easier portability, reduction in size of such devices is a major priority.

A digital camera often includes a zoom lens module and an image sensor, such as a charge coupled device (CCD). The lens module typically includes a lens barrel, lenses housed in the lens barrel, and a step motor for moving the lens barrel along an optical axis of the lenses. During capture, the optical axis of the lenses is ideally substantially perpendicular to a light sensing surface the image sensor. Typically, the step motor is connected with only one side of the lens barrel. Uneven force correspondingly applied to the lens barrel may thereby unfavorably angle the lens barrel with the image sensor.

Thus, a camera module providing perpendicularity adjustment is desired to overcome the limitations described.

BRIEF DESCRIPTION OF THE DRAWINGS

Many aspects of the present camera module can be better understood with reference to the following drawings. The components in the drawings are not necessarily drawn to scale, the emphasis instead being placed upon clearly illustrating the principles of the present camera module. Moreover, in the drawings, like reference numerals designate corresponding parts throughout the several views.

DETAILED DESCRIPTION

Reference will now be made to the drawings to describe the embodiments of the present camera module, in detail.

Figure 1:
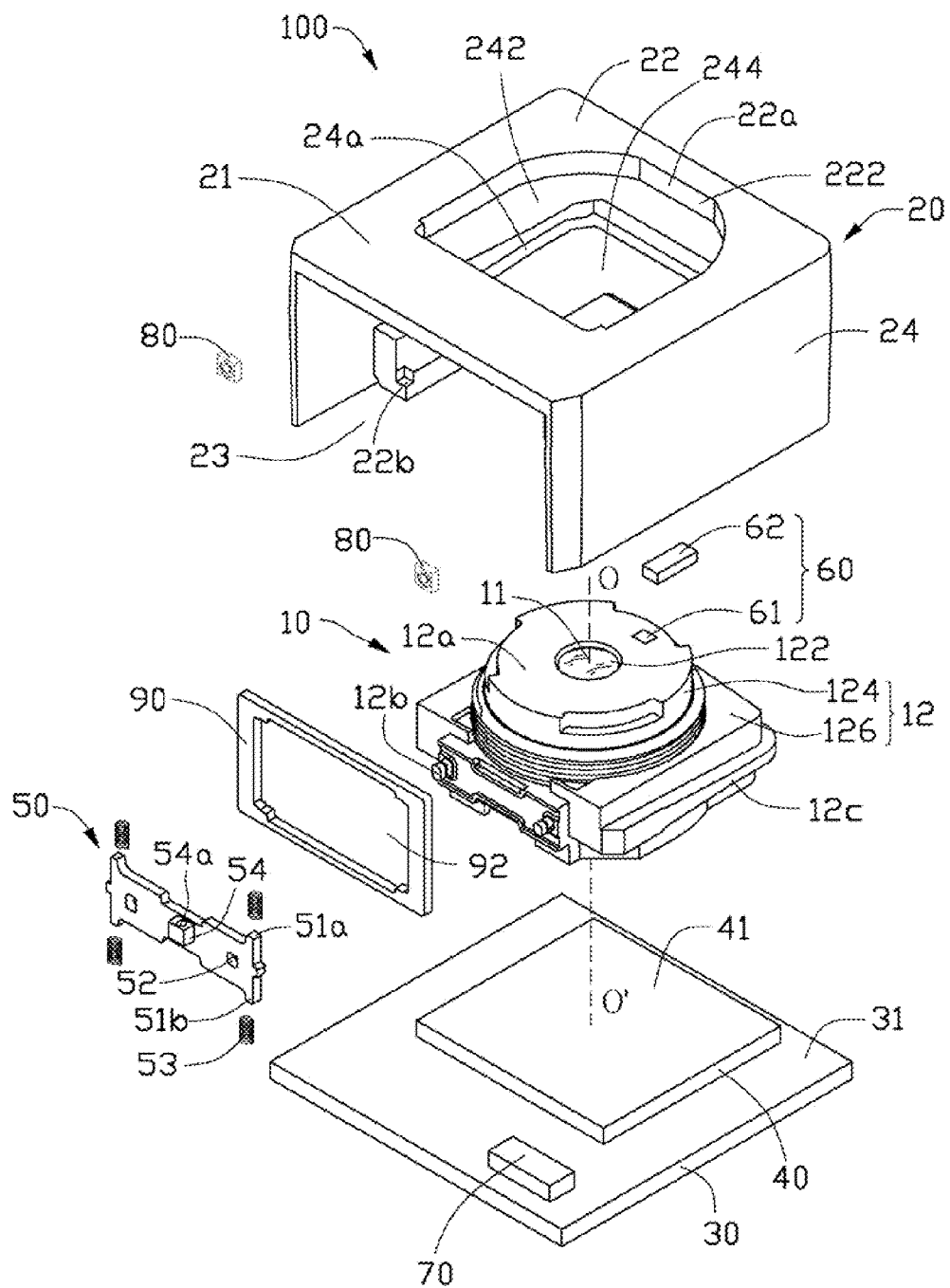
FIG. 1 is an exploded isometric view of a camera module including two perpendicularity adjustment assemblies in accordance with a first exemplary embodiment.
Figure 2:
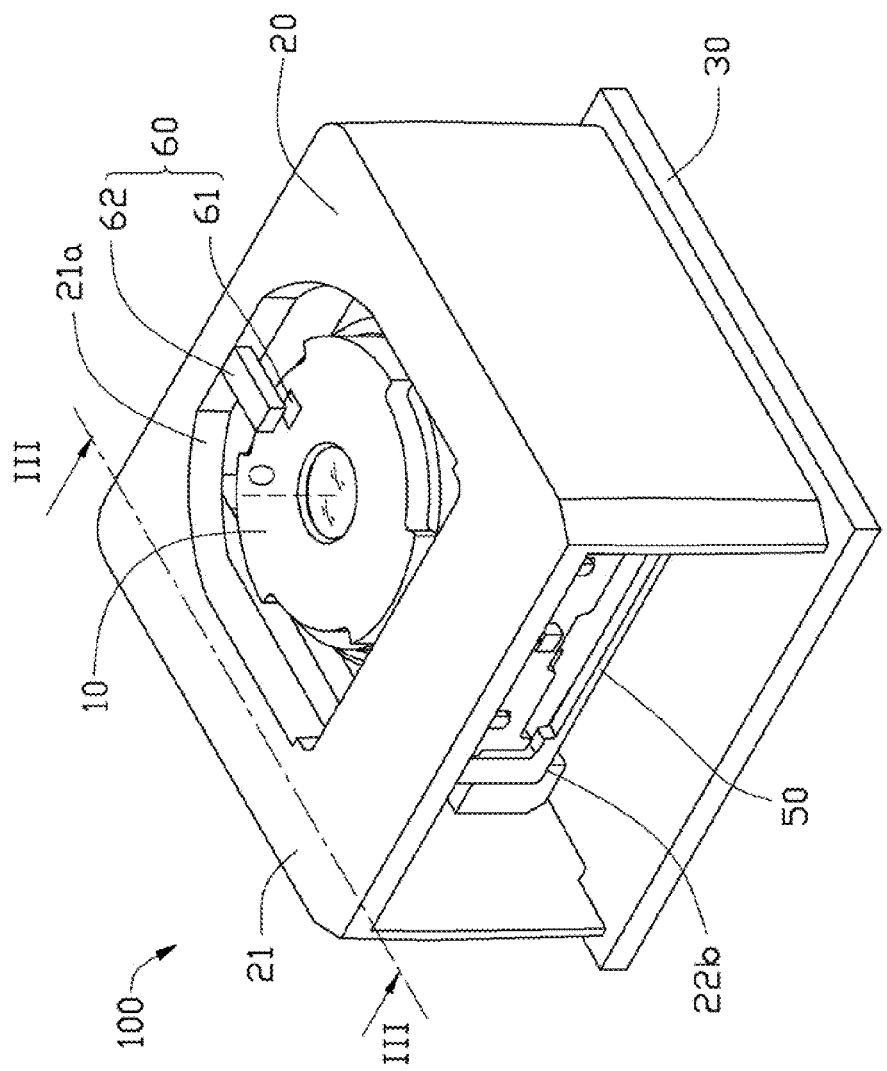
FIG. 2 is an assembled isometric view of the camera module shown in FIG. 1.

Referring to FIGS. 1 and 2, a camera module 100 in accordance with a first exemplary embodiment includes an optical assembly 10, a barrel holder 20 housing the optical assembly 10, a circuit board 30 and an image sensor 40.

The optical assembly 10 includes an optical lens group 11 and a lens barrel 12 housing the optical lens group 11. The lens barrel 12 includes a top portion 124 and a bottom portion 126. The top portion 124 is generally cylindrical and the bottom portion 126 is generally cuboid. The top portion 124 is stacked on and aligned with the bottom portion 126. In this embodiment, the top portion 124 is integrally connected with the bottom portion 126. Preferably, the top portion 124 and bottom portion 126 form a single body of material.

The optical lens group 11 includes at least one optical lens and has an optical axis OO' associated therewith. The lens barrel 12 has an end plane 12a at a distal end thereof. The end plane 12a is substantially perpendicular to the optical axis OO' of the optical lens group 11. A light incident hole 122 is defined in the end plane 12a. Ambient light reaches the optical lens group 11 by passing through the light incident hole 122.

The bottom portion 126 includes a flange 12c protruding from a periphery thereof. The flange 12c is formed on three side surfaces of the bottom portion 126, thus forming a "U" shape. On each side surface of the bottom portion 126, the flange 12c extends perpendicular to the optical axis OO'. Two positioning posts 12b are formed on the other of the four side surfaces of the bottom portion 126. In this embodiment, a line defined by interconnecting the two positioning posts 12b is perpendicular to the optical axis OO' of the optical lens group 11.

The barrel holder 20 is generally cuboid and includes a generally rectangular top board 22 and three side boards 24. A light incident opening 22a is defined through the top board 22. The top board 22 has four edges. The three side boards 24 extend perpendicularly downward from three of the four edges of the top board 22. In this embodiment, the three side boards 24 form a single body of material. Each of the three side boards 24 has a free end opposite to the top portion 124. An opening 23 is defined by two opposite boards 24 and the top board 22. The optical assembly 10 is installed into the barrel holder 20 from the opening 23. A sliding groove 24a is between on inner surfaces of the three side boards 24 by a top plate 242 and a bottom plate 244. The top plate 242 and the bottom plate 244 are each attached to the inner surfaces of the three side boards 24. Accordingly, the top plate 242 and the bottom plate 244 each have a "U" shape, as does sliding groove 24a forms a "U" shape. In this embodiment, on the inner surfaces of the three side boards 24, the sliding groove 24a extends perpendicular to the optical axis OO'. The flange 12c of the lens barrel 12 is received in the groove 24a. The sliding groove 24a is taller than a thickness of the flange 12c along an axis parallel to the optical axis OO', such that the optical assembly 10 can move along the optical axis OO' in the groove 24a. The top plate 242 and the bottom plate 244 each define two step portions 22b at two free ends of the U-shaped sliding groove 24a. The step portions 22b of the top plate 242 faces away from the top board 22 and the step portions 22b of the bottom plate 244 face the top board 22.

The circuit board 30 includes a top surface 31, on which image sensor 40 is fixed. The circuit board 30 and the image sensor 40 are positioned at the bottom side of the optical assembly 10. The image sensor 40 includes a light sensing surface 41 facing toward the optical assembly 10. The light sensing surface 41 is configured for sensing light hitting thereon. The light sensing surface 41 of the image sensor 40 is arranged perpendicular to the optical axis OO' of the optical lens group 11 such that the image sensor 40 can detect light passing through the optical lens group 11 from the exterior. In this embodiment, the barrel holder 20 is attached to the circuit board 30 in a manner such that the three side boards 24 are fixed on the top surface 31 of the circuit board 30. In one embodiment, one distal end of each of the three side boards 24 is glued (adhered) to the top surface 31 of the circuit board 30.

The camera module 100 further includes a connecting board 50, an angle measurement assembly 60, a controller 70, an perpendicularity adjustment assembly 80, and a position limit frame 90.

The connecting board 50 has an elongated shape. The connecting board 50 defines two positioning holes 52 therethrough. The positioning holes 52 each extend perpendicularly to the connecting board 50. The positioning holes 52 are arrayed around the positioning posts 12b on the bottom portion 12b to position the optical assembly 10, such that the optical assembly 10 can move along with the connecting board 50. A connecting member 54 is formed on the connecting board 50. In this embodiment, the connecting member 54 is positioned between the two positioning holes 52. A threaded hole 54a is defined therethrough for connection with a step motor (not shown) driving the connecting board 50, and thereby the optical assembly 10.

Two position limit posts 51a are formed on one side of the periphery of the connecting board 50 which faces the top wall 22. The two position limit posts 51a protrude perpendicularly toward the top wall 22. Another two position limit posts 51b are formed on one opposite side of the periphery of the connecting board 50 which faces the circuit board 30. The two position limit posts 51b protrude perpendicularly toward the circuit board 30 and align with the two position limit posts 51a. In this embodiment, height of the position limit post 51a is equal to that of the position limit post 51b.

The position limit frame 90 has a generally rectangular shape. The position limit frame 90 defines a generally rectangular hole 92 therein. A height of the hole 92 along an axis parallel with the optical axis OO' exceeds a distance between the distal end of one of the position limit posts 51a and the distal end of the aligned position limit post 51b. The connecting board 50 is placed in the rectangular hole 90. A coil spring 53 surrounds each of the position limit posts 51a and 51b. A length of the coil spring 53 in a relaxed state exceeds the height of each of the aligned position limit posts 51a and 51b. The connecting board 50 is placed in the rectangular hole 92. The springs 53 around the position limit posts 51a and 51b resist an inner surface of the position limit frame 90 in the rectangular hole 92, whereby the connecting board 50 is moveably fixed in the rectangular hole 92. The position limit frame 90 is received in the barrel holder 20 in a manner such that four corners of the position limit frame 90 each contact one of the four step portions 22b. Thus, the position limit frame 90 is fixed in the barrel holder 20.

The angle measurement assembly 60 includes a reflective element 61 and an angle sensor 62. The reflective element 61 is mounted on the end plane 12a perpendicular to the optical axis OO' of the optical lens group 11. The top board 22 has an inner surface 222 in the light incident opening 22a. The angle sensor 62 is mounted on the barrel holder 20. In this embodiment, the angle sensor 62 is mounted on the inner surface 222 and aligned with the reflective element 61. The angle sensor 62 is configured for emitting a light beam toward the reflective element 61 in a direction perpendicular to the light sensing surface 41 of the image sensor 40 and measuring an included angle between the emitted light beam and the light beam reflected by the reflective element 61. The included angle is associated with the perpendicularity of the optical axis to the light sensing surface of the image sensor. When an angle formed by the two light beams is between 0 to 10', the perpendicularity of the optical axis to the light sensing surface of the image sensor is acceptable. After receiving the light beam reflected by the reflective element 61 and comparing the two light beams, the angle sensor 62 generates a signal containing the measured perpendicularity value. The reflective plate 61 can alternatively be placed in other locations along the lens barrel 12, as long as the reflective plate 61 is perpendicular to the optical axis OO' of the optical lens group 11.

The controller 70 receives the deviation value signal generated by the angle sensor 62, and directs the perpendicularity adjustment assembly 80 to adjust the optical axis OO' of the optical lens group 11 accordingly. In this embodiment, the controller 70 is fixed on the top surface 31 of the circuit board 30.

Figure 3:
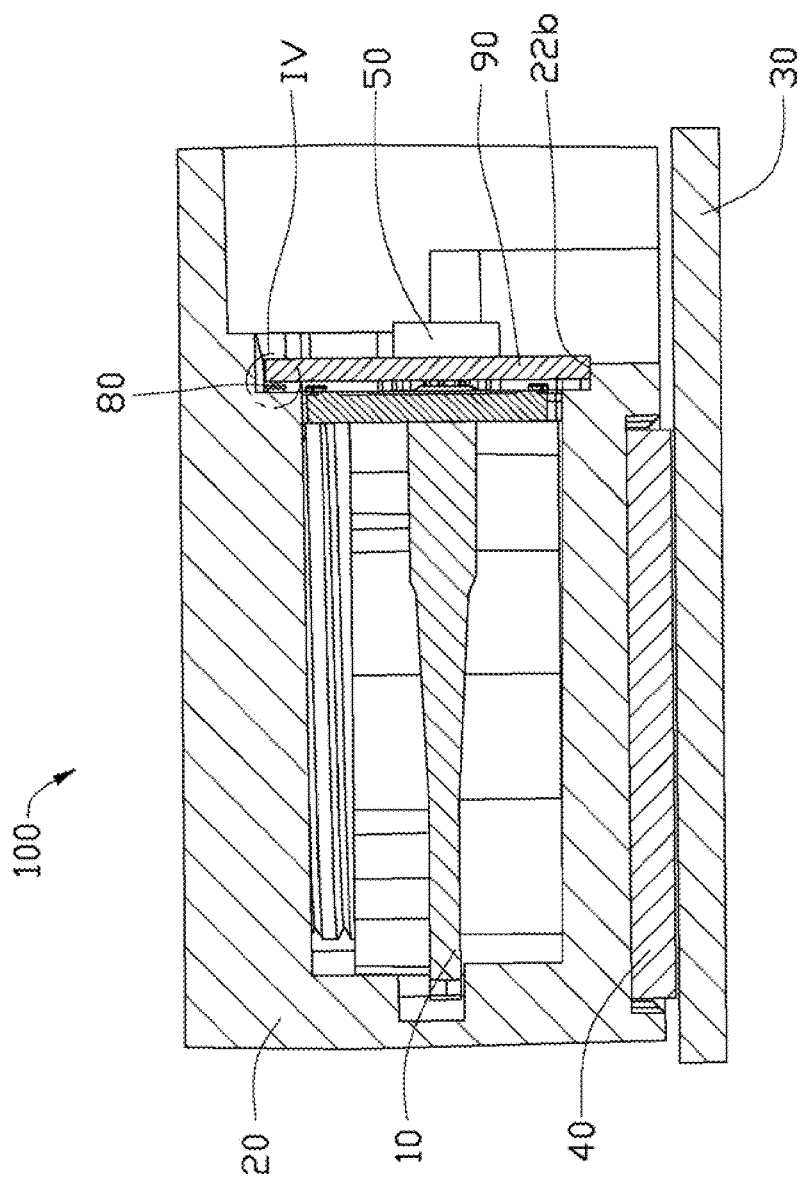
FIG. 3 is a cross-sectional view of the camera module taken along line III-III of FIG. 2, showing a position of one of the two perpendicularity adjustment assemblies in the camera module shown in FIG. 1.
Figure 4:
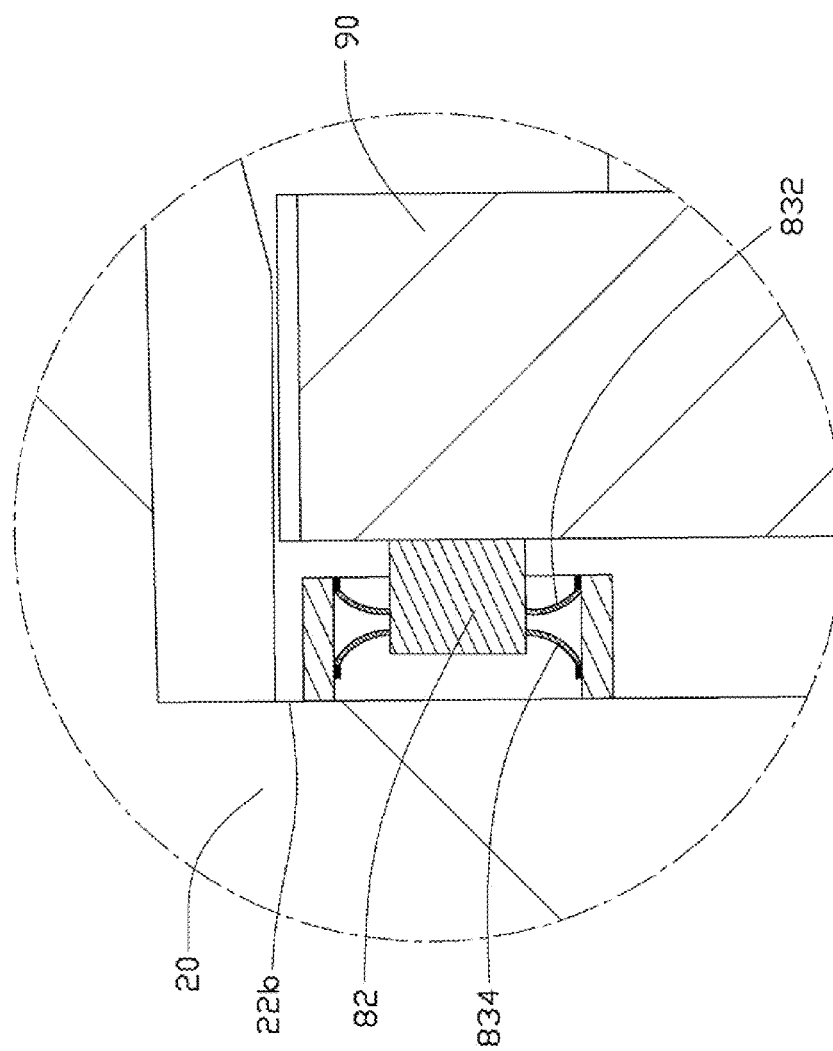
FIG. 4 is an enlarged view of a circled section IV of the camera module of FIG. 3.

Referring also to FIGS. 3 and 4, one of the two perpendicularity adjustment assemblies 80 can be positioned between the position board 90 and the top plate 242 on a radial axis of the optical axis OO'. The other perpendicularity adjustment assembly 80 is positioned between the position limit frame 90 and the bottom plate 244 on a radial axis of the optical axis OO'. In this embodiment, the two perpendicularity adjustment assemblies 80 are positioned at two opposite corners of the position limit frame 90. It is to be understood that the number of the perpendicularity adjustment assembly 80 can alternatively be one or more than two.

Figure 5:
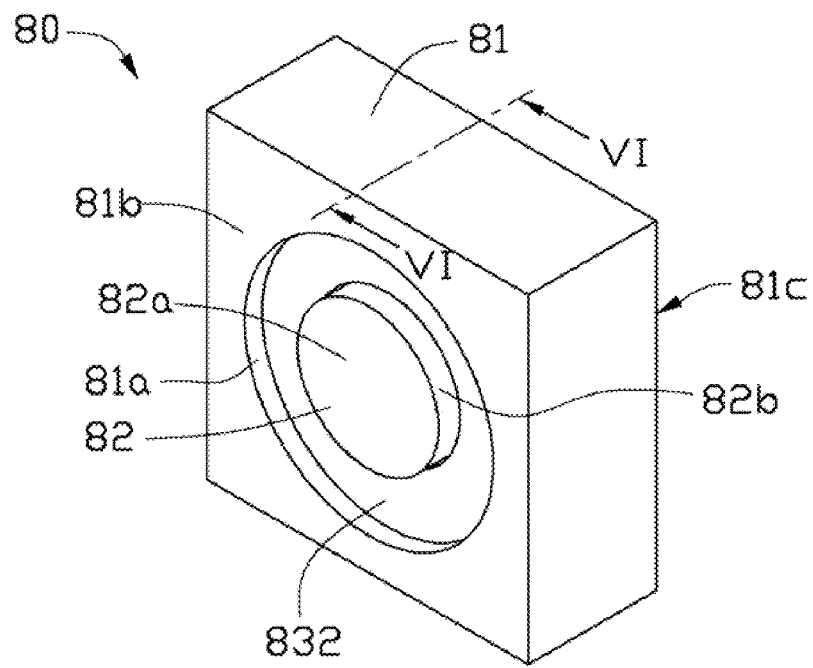
FIG. 5 is a schematic, isometric view of the perpendicularity adjustment assembly of the camera module shown in FIG. 1.
Figure 6:
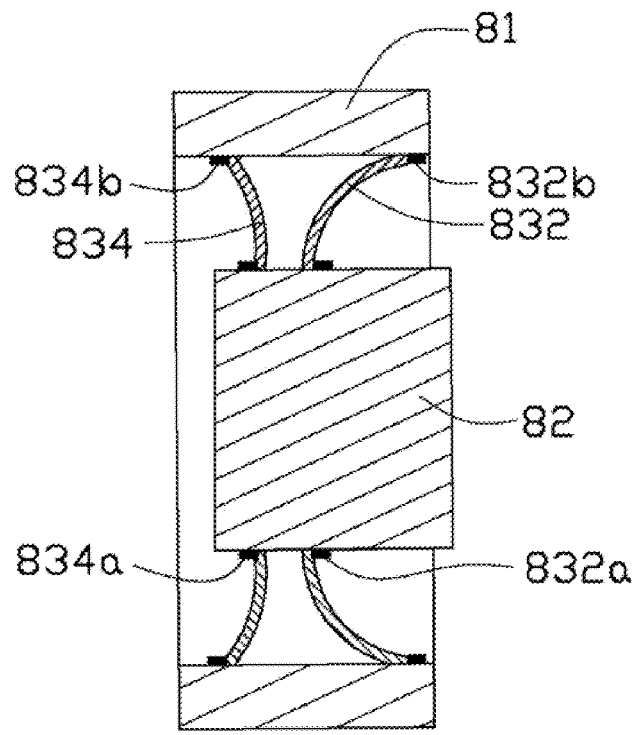
FIG. 6 is a cross-sectional view of the perpendicularity adjustment assembly taken along line VI-VI of FIG. 5.

Referring also to FIGS. 5 and 6, the perpendicularity adjustment assembly 80 includes a base plate 81, a movable member 82, and two annular electrostrictive pieces 832 and 834. In this embodiment, the base plate 81 is cuboid. A cylindrical through hole 81a is defined through a first surface 81b and an opposite second surface 81c. The second surface 81c is fixed on the top plate 242 or the bottom plate 244. In this embodiment, the second surface 81c is fixed to the top plate 242. It is to be understood that the second surface 81c can also be fixed on other parts of the barrel holder 20.

The movable member 82 is cylindrical, having a rounded end surface 82a and an adjacent side surface 82b. A diameter of the movable member 82 is less than that of the cylindrical through hole 81a. The movable member 82 is partly received in the cylindrical through hole 81a. The end surface 82a is fixed to the position limit frame 90.

The annular electrostrictive pieces 832 and 834 are comprised of a material selected from the group consisting of ion exchange membrane such as gel polymer, perfluoro sulphonate polymer, self-assembled monolayers, electrostrictive polymer, and piezoelectric polymer. The electrostrictive pieces 832 and 834 can elongate when voltage is applied. An inner periphery of each of the annular electrostrictive pieces 832 and 834 is fixed on the side surface 82b. An outer periphery of each of the annular electrostrictive pieces 832 and 834 is fixed on the inner surface of the base plate 82 in the cylindrical through hole 81a. The annular electrostrictive piece 832 is adjacent to the position limit frame 90 and tapered away from the position limit frame 90. Two annular electrodes 832a and 832b are connected with the inner and outer peripheries of the annular electrostrictive piece 832. The annular electrostrictive piece 834 is positioned away from the position limit frame 90 relative to the electrostrictive piece 832. The annular electrostrictive piece 834 tapers in a direction toward the position limit frame 90. Two annular electrodes 834a and 834b are connected with the inner and outer peripheries of the annular electrostrictive piece 834.

Figure 7:
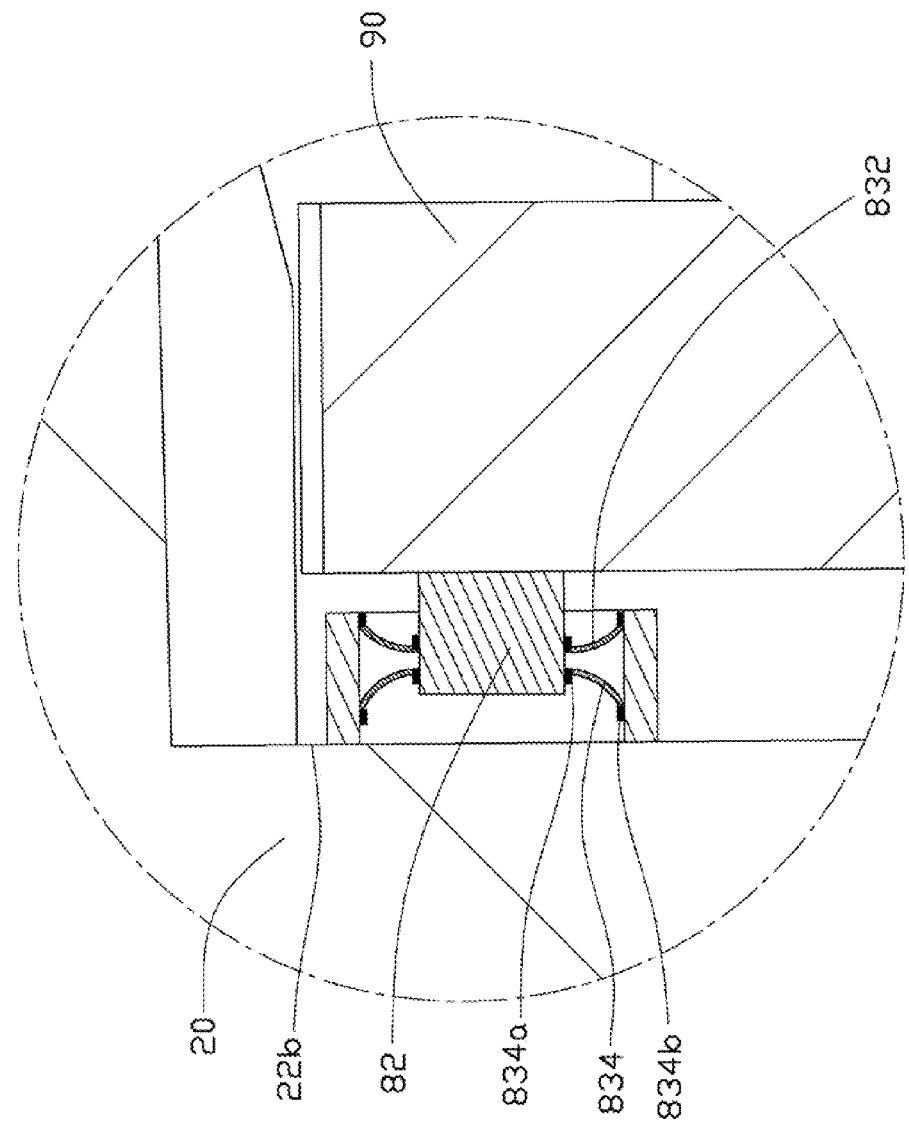
FIG. 7 shows the perpendicularity adjustment assembly in a first state when a first voltage is applied.

Referring to FIGS. 3 and 7, when the connecting board 50 is moved upward, the optical assembly 10 moves toward the top board 22 correspondingly. One side of the optical assembly 10 adjacent to the connecting board 50 moves more quickly than the other. Thus, after the connecting board 50 reaches a position and stops, the optical axis OO' optical assembly 10 may angle away from the connecting board 50. The angle sensor 62 detects the perpendicularity of the optical axis OO' to the light sensing surface 41 the image sensor 40, generates an electrical signal containing the perpendicularity value, and transmits the electrical signal to the controller 70. The controller 70 directs the perpendicularity adjustment assembly 80 to adjust the optical axis OO' to bring the perpendicularity value within an acceptable range. In this embodiment, only the perpendicularity adjustment assembly 80 between the position board 90 and the top plate 242 is used and described. Here a voltage is applied to the two electrodes 834a and 834b, and annular electrostrictive piece 834 elongates radially. Because the width of a gap between the outer periphery of the movable member 82 and the inner periphery of the base plate 82 is unchangeable, the annular electrostrictive piece 834 moves the movable member 82 toward the position limit frame 90. Thus, a top portion of the position limit frame 90 moves out of the barrel holder 20. A top portion of the connecting board 50 also moves out of the barrel holder 20 along with the position limit frame 90. Thus the optical axis OO' is adjusted. The elongated length of the annular electrostrictive piece 834 is controlled by voltage applied to the electrodes 834a and 834b to within an acceptable range.

Figure 8:
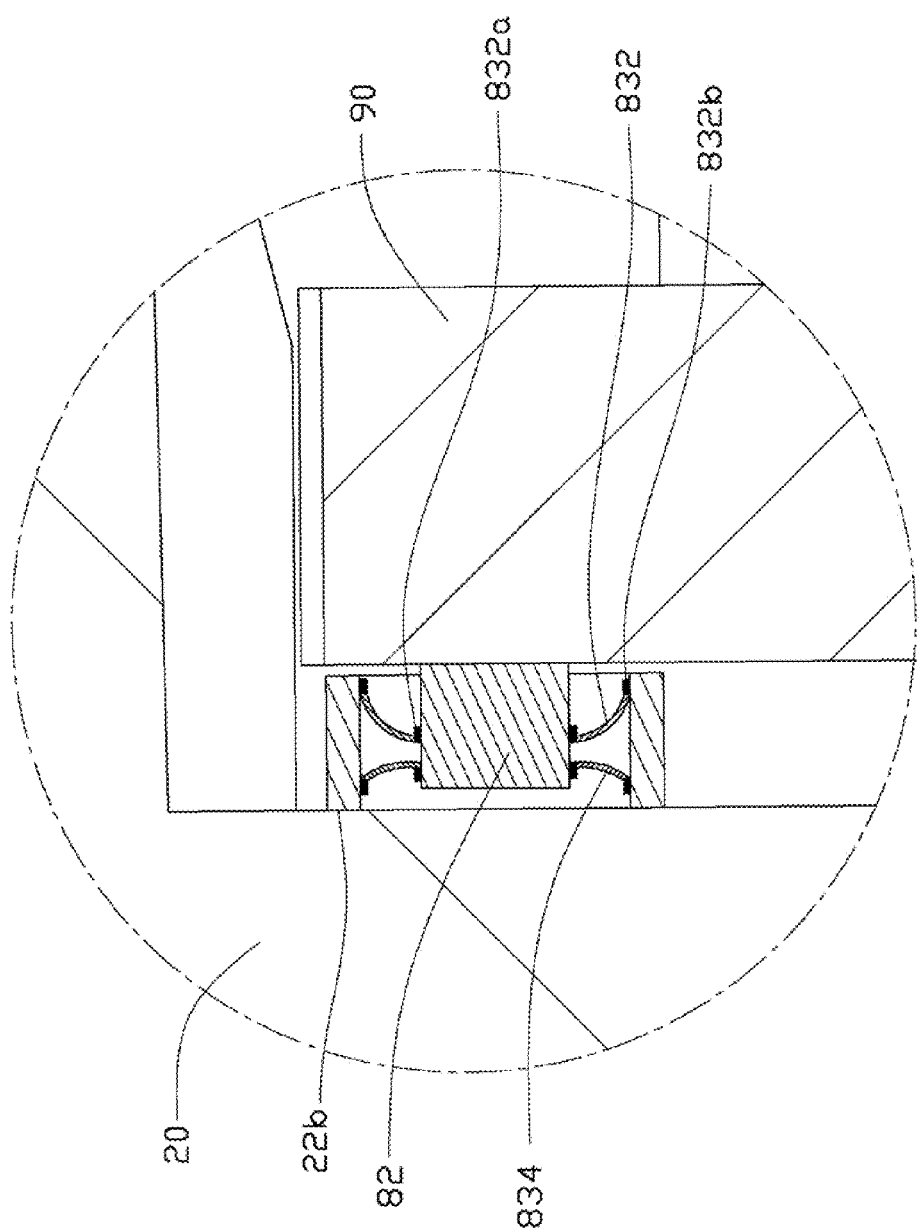
FIG. 8 shows the perpendicularity adjustment assembly in a second state when a second voltage is applied.

Referring to FIGS. 3 and 8, when the connecting board 50 is moved downward, the optical assembly 10 moves away from the top board 22 correspondingly. One side of the optical assembly 10 adjacent to the connecting board 50 moves more quickly than the opposite side of the optical assembly 10. Therefore, after the connecting board 50 stops, the optical axis OO' optical assembly 10 may be angled toward the side of the optical assembly 10 adjacent to the connecting board 50. In this embodiment, only the perpendicularity adjustment assembly 80 between the position board 90 and the top plate 242 is used and described. Using a method similar to that described, the annular electrostrictive piece 832 elongates, such that a top portion of the position limit frame 90 moves into the barrel holder 20. A top portion of the connecting board 50 also moves into the barrel holder 20 along with the position limit frame 90. Thus the optical axis OO' is adjusted. The elongated length of the annular electrostrictive piece 832 is controlled by the voltage applied to the electrodes 832a and 832b, such that perpendicularity of the optical axis OO' to the light sensing surface 41 of the image sensor 40 can be adjusted to an acceptable range.

The perpendicularity adjustment assembly 80 can adjust the optical axis OO' of the optical assembly 10 to substantially perpendicular to the image sensor 40, thereby increasing imaging quality of the camera module 100.

Figure 9:
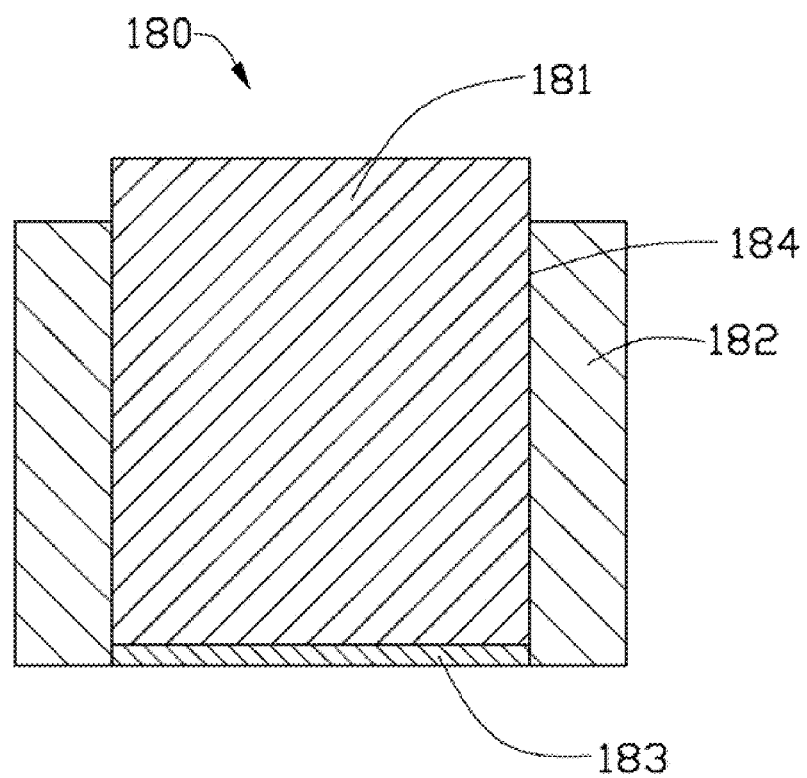
FIG. 9 is a cross-sectional view of an perpendicularity adjustment assembly in accordance with a second exemplary embodiment.

Referring to FIG. 9, a perpendicularity adjustment assembly 180 in accordance with a second exemplary embodiment includes an electrostrictive member 181, a base portion 182 and an electrode 183. The perpendicularity adjustment assembly 180 can be applied to the camera module 100 of the first exemplary embodiment to replace the perpendicularity adjustment assembly 80. The base portion 182 is cylindrical. A cylindrical hole 184 is defined through the base portion 182. When the perpendicularity adjustment assembly 180 is used in the camera module 100, a principal axis of the cylindrical hole 184 is parallel to the light sensing surface 41 of the image sensor 40. The electrostrictive member 181 is received in the cylindrical hole 184. The electrode 183 is received in the cylindrical hole 184 and connected with a distal end of the electrostrictive member 181. When an electrical current is applied to the electrode 183, the electrostrictive member 181 can elongate along a principal axis of the cylindrical hole 184.

Figure 10:
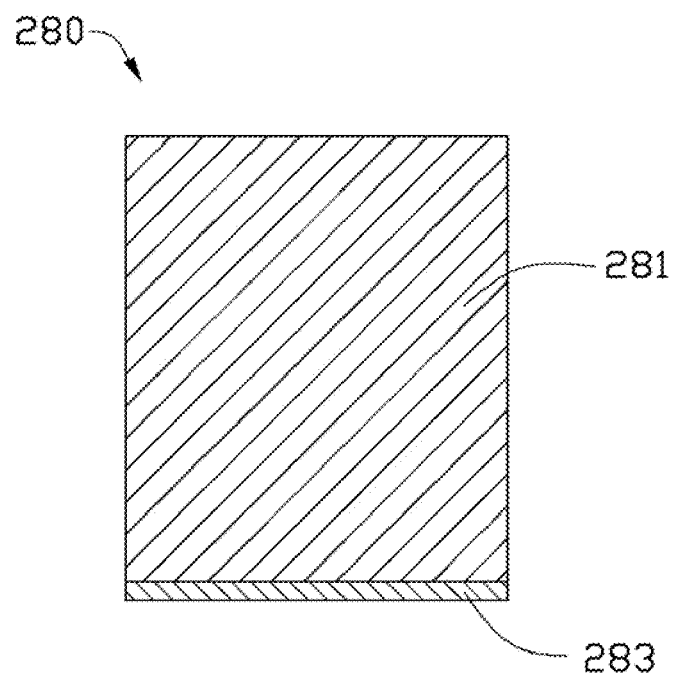
FIG. 10 is a cross-sectional view of an perpendicularity adjustment assembly in accordance with a third exemplary embodiment.

Referring to FIG. 10, a perpendicularity adjustment assembly 280 in accordance with a third exemplary embodiment includes an electrostrictive member 281 and an electrode 283. In this embodiment, the electrostrictive member 281 is cylindrical. The electrode 283 is connected with one distal end of the electrostrictive member 281. When an electrical current is applied to the electrode 283, the electrostrictive member 281 elongates along a principal axis thereof. The perpendicularity adjustment assembly 280 can replace the perpendicularity adjustment assembly 80 of the first exemplary embodiment.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A camera module comprising:
   an optical assembly comprising an optical lens group and a lens barrel housing the optical lens group, the optical lens group having an optical axis associated therewith;
   an image sensor having a light sensing surface, the light sensing surface being arranged perpendicular to the optical axis;
   a barrel holder in which the optical assembly and the image sensor are housed;
   an angle measurement assembly for measuring perpendicularity of the optical axis to the light sensing surface of the image sensor;
   a perpendicularity adjustment assembly arranged between the optical assembly and the barrel holder, the perpendicularity adjustment assembly comprising an electrostrictive member, a movable member and a base plate, a through hole defined through a first surface and an opposite second surface of the base plate, the through hole having a principal axis parallel to the light sensing surface of the image sensor, the electrostrictive member comprising first and second annular electrostrictive pieces, the first and second annular electrostrictive pieces being spaced apart from each other in a direction parallel to the principal axis, the first electrostrictive piece adjacent to the optical assembly and tapering in a direction away from the optical assembly, the second electrostrictive piece at an opposite side of the first electrostrictive piece to the optical assembly and tapering in a direction toward the optical assembly, the electrostrictive member being received in the through hole, the electrostrictive member interconnecting the movable member with the base plate, the base plate being fixed on the barrel holder and the movable member being fixed on the optical assembly, the electrostrictive member being extendable along the principal axis of the through hole in response to a voltage, to move the movable member away from the base plate, thereby adjusting the perpendicularity of the optical axis to the light sensing surface; and
   a controller for providing the voltage to the perpendicularity adjustment assembly to deform the electrostrictive member.

2. The camera module of claim 1, wherein the angle measurement assembly comprises an angle sensor and a reflective element having a reflective surface facing the angle sensor, the reflective element being fixed on the optical assembly with the reflective surface perpendicular to the optical axis of the optical assembly, the angle sensor being fixed on the barrel holder and configured for emitting a light beam toward the reflective element in a direction perpendicular to the light sensing surface of the image sensor and measuring an included angle between the emitted light beam and the light beam reflected by the reflective element, thus determining the perpendicularity of the optical axis to the light sensing surface of the image sensor.

3. The camera module of claim 2, wherein the barrel holder comprises is generally cuboid and includes a generally rectangular top board and three side boards, a light incident opening being defined through the top board, the top board having four edges, the three side boards extending perpendicularly downward from three of the four edges of the top board, a top plate and a bottom plate being each attached to the inner surfaces of the three side boards, the top plate being adjacent to the top board and the bottom plate being away from the top board, thereby a U-shaped sliding groove being defined between the top plate and the bottom plate, the lens barrel comprising a flange protruding a periphery thereof, the lens barrel comprising four side surfaces, the flange being formed on three of the four side surfaces of the bottom portion, thus forming a "U" shape, the U-shaped flange being received in the groove, on each side surface of the lens barrel, the flange extending perpendicular to the optical axis.

4. The camera module of claim 3, wherein a positioning post is formed on the other of the four side surfaces of the lens barrel, the camera module further comprising a connecting board and a position limit frame, the connecting board defining a positioning hole therethrough, the positioning hole being arranged around the positioning post, two first position limit posts being formed on one side of the periphery of the connecting board which faces the top wall, two second position limit posts being formed on one opposite side of the periphery of the connecting board which faces the image sensor, the position limit frame having a generally rectangular shape and defining a generally rectangular hole therein, the connecting board being placed in the rectangular hole, a coil spring surrounding each of the first and second position limit posts, the springs being around the first and second position limit posts and resisting an inner surface of the position limit frame in the rectangular hole, whereby the connecting board is moveably fixed in the rectangular hole, the top plate and the bottom plate each defining two step portions at two free ends of the U-shaped sliding groove, the position limit frame being received in the barrel holder in a manner such that four corners of the position limit frame each contact one of the four step portions.

5. The camera module of claim 4, wherein the movable member has an end surface and an adjacent side surface, the end surface being fixed to the position limit frame, and an inner periphery of each of the first and second annular electrostrictive pieces being fixed on the side surface, the second surface of the base plate being fixed on the inner side surface of the barrel holder.

6. The camera module of claim 3, wherein the reflective element is fixed on an end plane perpendicular to the optical axis, the top board having an inner surface in the light incident opening, the angle sensor being mounted on the inner surface of the top board and aligned with the reflective element.

7. The camera module of claim 1, wherein the base plate is fixed on an inner side surface of the barrel holder, and the movable member is fixed on an outer side surface of the optical assembly.

8. The camera module of claim 1, wherein the electrostrive member is comprised of a material selected from the group consisting of ion exchange membrane, gel polymer, perfluoro sulphonate polymer, self-assembled monolayers, electrostrictive polymer, and piezoelectric polymer.

9. A camera module comprising:
an optical assembly comprising an optical lens group and a lens barrel housing the optical lens group, the optical lens group having an optical axis associated therewith;
an image sensor facing the optical assembly having a light sensing surface, the light sensing surface being arranged perpendicular to the optical axis;
a barrel holder in which the optical assembly and the image sensor are housed;
a perpendicularity adjustment assembly arranged between the optical assembly and the barrel holder, the perpendicularity adjustment assembly comprising an electrostrictive member, a movable member and a base plate, a through hole defined through a first surface and an opposite second surface of the base plate, the through hole having a principal axis parallel to the light sensing surface of the image sensor, the electrostrictive member comprising first and second annular electrostrictive pieces, the first and second annular electrostrictive pieces being spaced apart from each other in a direction parallel to the principal axis, the first electrostrictive piece adjacent to the optical assembly and tapering in a direction away from the optical assembly, the second electrostrictive piece at an opposite side of the first electrostrictive piece to the optical assembly and tapering in a direction toward the optical assembly, the electrostrictive member being received in the through hole, the electrostrictive member interconnecting the movable member with the base plate, the base plate being fixed on the barrel holder and the movable member being fixed on the optical assembly, the electrostrictive member being extendable along the principal axis of the through hole in response to a voltage, to move the movable member away from the base plate, thereby adjusting the perpendicularity of the optical axis to the light sensing surface; and
a controller for providing the voltage to the perpendicularity adjustment assembly to deform the electrostrictive member.

10. The camera module of claim 9, further comprising an angle measurement assembly for measuring perpendicularity of the optical axis to the light sensing surface of the image sensor.

11. The camera module of claim 10, wherein the angle measurement assembly comprises an angle sensor and a reflective element having a reflective surface facing the angle sensor, the reflective element being fixed on the optical assembly with the reflective surface perpendicular to the optical axis of the optical assembly, the angle sensor being fixed on the barrel holder and configured for emitting a light beam toward the reflective element in a direction perpendicular to the light sensing surface of the image sensor and measuring an included angle between the emitted light beam and the light beam reflected by the reflective element, thus determining the perpendicularity of the optical axis to the light sensing surface of the image sensor.

12. The camera module of claim 9, wherein the base plate is fixed on an inner side surface of the barrel holder, and the movable member is fixed on an outer side surface of the optical assembly.

13. The camera module of claim 9, wherein the electrostrive member is comprised of a material selected from the group consisting of ion exchange membrane, gel polymer, perfluoro sulphonate polymer, self-assembled monolayers, electrostrictive polymer, and piezoelectric polymer.

14. A camera module, comprising:
- an optical assembly comprising an optical lens group and a lens barrel housing the optical lens group, the optical lens group having an optical axis associated therewith;
- an image sensor having a light sensing surface, the light sensing surface being arranged perpendicular to the optical axis;
- a barrel holder in which the optical assembly and the image sensor are housed, the barrel holder comprises being generally cuboid and including a generally rectangular top board and three side boards, a light incident opening being defined through the top board, the top board having four edges, the three side boards extending perpendicularly downward from three of the four edges of the top board, a top plate and a bottom plate being each attached to the inner surfaces of the three side boards, the top plate being adjacent to the top board and the bottom plate being away from the top board, thereby a U-shaped sliding groove being defined between the top plate and the bottom plate, the lens barrel comprising a flange protruding a periphery thereof, the lens barrel comprising four side surfaces, the flange being formed on three of the four side surfaces of the bottom portion, thus forming a "U" shape, the U-shaped flange being received in the groove, on each side surface of the lens barrel, the flange extending perpendicular to the optical axis;
- a perpendicularity adjustment assembly arranged between the optical assembly and the barrel holder, comprising an electrostrictive member deformable in response to a voltage, thereby adjusting the perpendicularity of the optical axis to the light sensing surface; and
- a controller for providing the voltage to the perpendicularity adjustment assembly to deform the electrostrictive member.

15. The camera module of claim 14, wherein a positioning post is formed on one of the four side surfaces of the lens barrel with free of the flange thereon, the camera module further comprising a connecting board and a position limit frame, the connecting board defining a positioning hole therethrough, the positioning hole being arranged around the positioning post, two first position limit posts being formed on one side of the periphery of the connecting board which faces the top wall, two second position limit posts being formed on an opposite side of the periphery of the connecting board which faces the image sensor, the position limit frame having a generally rectangular shape and defining a generally rectangular hole therein, the connecting board being placed in the rectangular hole, a coil spring surrounding each of the first and second position limit posts, the springs being around the first and second position limit posts and resisting an inner surface of the position limit frame in the rectangular hole, whereby the connecting board is moveably fixed in the rectangular hole, the top plate and the bottom plate each defining two step portions at two free ends of the U-shaped sliding groove, the position limit frame being received in the barrel holder in a manner such that four corners of the position limit frame each contact one of the four step portions.

16. The camera module of claim 15, wherein the perpendicularity adjustment assembly comprises an electrostrictive member, a movable member and a base plate, a through hole defined through a first surface and an opposite second surface of the base plate, the through hole having a principal axis parallel to the light sensing surface of the image sensor, the electrostrictive member comprising first and second annular electrostrictive pieces, the first and second annular electrostrictive pieces being spaced apart from each other in a direction parallel to the principal axis, the first electrostrictive piece adjacent to the optical assembly and tapering in a direction away from the optical assembly, the second electrostrictive piece at an opposite side of the first electrostrictive piece to the optical assembly and tapering in a direction toward the optical assembly, the electrostrictive member being received in the through hole, the electrostrictive member interconnecting the movable member with the base plate, the base plate being fixed on the top plate of the barrel holder and the movable member being fixed to the position limit frame, the electrostrictive member being extendable along the principal axis of the through hole in response to a voltage, to move the movable member away from the base plate, thereby adjusting the perpendicularity of the optical axis to the light sensing surface.

* * * * *